United States Patent
Im et al.

(10) Patent No.: US 9,252,031 B2
(45) Date of Patent: Feb. 2, 2016

(54) SEMICONDUCTOR PACKAGE AND METHOD OF FABRICATING THE SAME

(71) Applicant: Samsung Electronics Co., Ltd., Suwon-si (KR)

(72) Inventors: Hohyeuk Im, Seoul (KR); Jongkook Kim, Hwaseong-si (KR); Gowoon Seong, Gimcheon-si (KR); SeokWon Lee, Seongnam-si (KR); Byoungwook Jang, Hwaseong-si (KR); Eunseok Cho, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/493,379

(22) Filed: Sep. 23, 2014

(65) Prior Publication Data
US 2015/0084170 A1    Mar. 26, 2015

(30) Foreign Application Priority Data

Sep. 23, 2013    (KR) ................. 10-2013-0112739

(51) Int. Cl.
*H01L 23/495*    (2006.01)
*H01L 21/56*    (2006.01)
(Continued)

(52) U.S. Cl.
CPC .......... *H01L 21/563* (2013.01); *H01L 23/3677* (2013.01); *H01L 23/49811* (2013.01); *H01L 23/49816* (2013.01); *H01L 23/49827* (2013.01); *H01L 23/49833* (2013.01); *H01L 23/5389* (2013.01); *H01L 24/97* (2013.01); *H01L 25/105* (2013.01); *H01L 25/50* (2013.01); *H01L 23/3128* (2013.01); *H01L 24/11* (2013.01);
(Continued)

(58) Field of Classification Search
CPC ... H01L 23/49568; H01L 24/09; H01L 24/89; H01L 24/48; H01L 21/563; H01L 2924/01029; H01L 2924/1438; H01L 2224/04073; H01L 2224/08237; H01L 2224/08257; H01L 2224/09519; H01L 2224/09181

See application file for complete search history.

(56) References Cited

U.S. PATENT DOCUMENTS 8,017,437 B2    9/2011    Yoo et al.
8,319,338 B1    11/2012    Berry et al.
(Continued)

FOREIGN PATENT DOCUMENTS

JP    2009-038192    2/2009
KR    10-2007-0027190 A    3/2007
(Continued)

*Primary Examiner* — Roy Potter
(74) *Attorney, Agent, or Firm* — Muir Patent Law, PLLC

(57) ABSTRACT

Provided is a semiconductor package including a lower package, an interposer on the lower package, and an upper package on the interposer. The lower package may include a lower package substrate, a lower semiconductor chip on the lower package substrate, and a lower heat-transfer layer on the lower semiconductor chip. The interposer may include an interposer substrate, first and second heat-transfer openings defined by recessed bottom and top surfaces, respectively, of the interposer substrate, an upper interposer heat-transfer pad disposed in the second heat-transfer opening, and an upper heat-transfer layer disposed on the upper interposer heat-transfer pad. The upper package may include an upper package substrate, an upper package heat-transfer pad, which may be disposed in a third heat-transfer opening defined by a recessed bottom surface of the upper package substrate, and an upper semiconductor chip disposed on the upper package substrate.

21 Claims, 15 Drawing Sheets

(51) Int. Cl.
- *H01L 23/367* (2006.01)
- *H01L 23/498* (2006.01)
- *H01L 23/538* (2006.01)
- *H01L 25/10* (2006.01)
- *H01L 25/00* (2006.01)
- *H01L 23/00* (2006.01)
- *H01L 23/31* (2006.01)

(52) U.S. Cl.
CPC .................. *H01L24/16* (2013.01); *H01L 24/32* (2013.01); *H01L 24/45* (2013.01); *H01L 24/46* (2013.01); *H01L 24/73* (2013.01); *H01L 24/81* (2013.01); *H01L 24/83* (2013.01); *H01L 24/92* (2013.01); *H01L 2224/0401* (2013.01); *H01L 2224/04042* (2013.01); *H01L 2224/1132* (2013.01); *H01L 2224/11312* (2013.01); *H01L 2224/16225* (2013.01); *H01L 2224/32225* (2013.01); *H01L 2224/32245* (2013.01); *H01L 2224/451* (2013.01); *H01L 2224/48091* (2013.01); *H01L 2224/48227* (2013.01); *H01L 2224/73253* (2013.01); *H01L 2224/73265* (2013.01); *H01L 2224/81191* (2013.01); *H01L 2224/81192* (2013.01); *H01L 2224/81801* (2013.01); *H01L 2224/83191* (2013.01); *H01L 2224/92225* (2013.01); *H01L 2224/97* (2013.01); *H01L 2225/0651* (2013.01); *H01L 2225/06568* (2013.01); *H01L 2225/1023* (2013.01); *H01L 2225/1041* (2013.01); *H01L 2225/1058* (2013.01); *H01L 2225/1094* (2013.01); *H01L 2924/00014* (2013.01); *H01L 2924/12042* (2013.01); *H01L 2924/1431* (2013.01); *H01L 2924/1434* (2013.01); *H01L 2924/1438* (2013.01); *H01L 2924/15159* (2013.01); *H01L 2924/15311* (2013.01); *H01L 2924/15331* (2013.01)

(56) References Cited

U.S. PATENT DOCUMENTS

| | | | |
|---|---|---|---|
| 8,884,425 B1 * | 11/2014 | Mohammed | H01L 23/49827 257/706 |
| 2006/0175695 A1 | 8/2006 | Lee | |
| 2008/0128882 A1 | 6/2008 | Baek et al. | |
| 2008/0136003 A1 | 6/2008 | Pendse | |
| 2012/0211885 A1 | 8/2012 | Choi et al. | |
| 2013/0001797 A1 | 1/2013 | Choi et al. | |
| 2015/0115466 A1 * | 4/2015 | Kim | H01L 23/13 257/774 |

FOREIGN PATENT DOCUMENTS

| | | |
|---|---|---|
| KR | 10-2009-0091488 A | 8/2009 |
| KR | 10-2009-0123680 A | 12/2009 |
| KR | 10-2012-0031817 A | 4/2012 |

* cited by examiner

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0112739, filed on Sep. 23, 2013, in the Korean Intellectual Property Office, the entire contents of which are hereby incorporated by reference.

BACKGROUND OF THE INVENTION

This disclosure relates to semiconductor packages and methods of fabricating the same, and in particular, to semiconductor packages with improved heat-dissipation characteristics and methods of fabricating the same.

As performance of electronic products is improved, heat produced in electronic devices is increased. To overcome such a heat problem, a way of limiting performance of the electronic device is being used, when the electronic device reaches a predetermined temperature. However, this way makes it difficult to improve efficiency of the electronic device, because the more heat the electronic devices produce, the more often performance of the electronic devices is limited.

SUMMARY

Example embodiments provide semiconductor packages with improved heat-dissipation characteristics.

Other example embodiments provide methods of fabricating a semiconductor package with improved heat-dissipation characteristics.

According to example embodiments, a semiconductor package may include a lower package including a lower package substrate, a lower semiconductor chip disposed on the lower package substrate, and a lower heat-transfer layer disposed on the lower semiconductor chip, an interposer provided on the lower package, the interposer including an interposer substrate, a first heat-transfer opening defined by a recessed bottom surface of the interposer substrate, a second heat-transfer opening defined by a recessed top surface of the interposer substrate, an upper interposer heat-transfer pad disposed in the second heat-transfer opening, and an upper heat-transfer layer disposed on the upper interposer heat-transfer pad, and an upper package provided on the interposer, the upper package including an upper package substrate, an upper package heat-transfer pad disposed in a third heat-transfer opening defined by a recessed bottom surface of the upper package substrate, and an upper semiconductor chip disposed on the upper package substrate. The lower heat-transfer layer may be provided in the first heat-transfer opening to be in contact with the upper interposer heat-transfer pad exposed to the first heat-transfer opening, and the upper heat-transfer layer may be provided in the third heat-transfer opening to be in contact with the upper package heat-transfer pad.

In example embodiments, the semiconductor package may further include a lower interposer heat-transfer pad provided spaced apart from the upper interposer heat-transfer pad and disposed in the first heat-transfer opening. The lower interposer heat-transfer pad may be in contact with the lower heat-transfer layer.

In example embodiments, the interposer substrate includes internal wires and the lower interposer heat-transfer pad includes a portion of internal wires of the interposer substrate, and the lower heat-transfer layer is formed of a thermal interface material.

In example embodiments, the semiconductor package may further include conductive connecting portions interposed between the lower package and the interposer to connect the lower package electrically to the interposer.

In example embodiments, the semiconductor package may further include an under-fill resin layer filling a gap region between the lower package and the interposer and contacting the conductive connecting portions.

In example embodiments, the semiconductor package may further include a lower molding layer provided on the lower package substrate to cover the lower semiconductor chip. The lower molding layer may be provided to define through-holes, in which the conductive connecting portions, respectively, may be disposed.

In example embodiments, the interposer substrate may be a printed circuit board including a plurality of insulating layers and internal wires provided between the insulating layers.

In example embodiments, the upper interposer heat-transfer pad may include a portion of the internal wires.

In example embodiments, the lower heat-transfer layer has a thickness that may be equal to or larger than a depth of the first heat-transfer opening.

In example embodiments, the upper heat-transfer layer has a thickness that may be equal to or larger than a sum of depths of the second and third heat-transfer openings.

In example embodiments, the semiconductor package may further include upper solder balls provided on the bottom surface of the upper package substrate that electrically contact the top surface of the interposer substrate.

According to example embodiments, a method of fabricating a semiconductor package may include forming lower conductive connecting portions on a lower package substrate, mounting a lower semiconductor chip on the lower package substrate provided with the lower conductive connecting portions, forming a lower heat-transfer layer on the lower semiconductor chip, stacking an interposer, including an interposer substrate and upper conductive connecting portions attached to a bottom surface of the interposer substrate, on the lower semiconductor chip, in such a way that the upper conductive connecting portions are attached to the lower conductive connecting portions, performing a reflow process to the lower and upper conductive connecting portions to form conductive connecting portions, forming an under-fill resin layer between the lower package substrate and the interposer substrate, and stacking an upper package on the interposer.

In example embodiments, the method may further include before the stacking of the interposer, etching a portion of a bottom surface of the interposer substrate to form a first heat-transfer opening exposing a lower interposer heat-transfer pad, and etching a portion of a top surface of the interposer substrate to form a second heat-transfer opening exposing an upper interposer heat-transfer pad.

In example embodiments, the stacking of the interposer may include providing the lower heat-transfer layer in the first heat-transfer opening to be in contact with the lower interposer heat-transfer pad.

In example embodiments, the method may further include before the stacking of the upper package, forming an upper heat-transfer layer on the second heat-transfer opening, and etching a portion of a bottom surface of an upper package substrate to form a third heat-transfer opening exposing an upper package heat-transfer pad.

In example embodiments, the stacking of the upper package may include providing the upper heat-transfer layer in the third heat-transfer opening to be in contact with the upper package heat-transfer pad.

In further example embodiments, a semiconductor package includes a lower package including a lower package substrate and at least a first semiconductor chip disposed thereon, and an interposer stacked on the lower package. The interposer includes internal wires and a plurality of insulating layers, has an upper surface and a lower surface, and includes an upper recess at the upper surface and a lower recess, opposite the upper recess, at the lower surface. The semiconductor package further includes an upper package including an upper package substrate and at least a second semiconductor chip disposed thereon; and a lower heat transfer layer formed of a thermal interface material, the lower heat transfer layer disposed in the lower recess and thermally connecting the first semiconductor chip to at least a first internal wire of the interposer.

In certain embodiments, the semiconductor further includes an upper heat transfer layer, the upper heat transfer layer disposed in the upper recess and thermally connecting the upper package substrate to at least a second internal wire of the interposer.

At least the lower heat transfer layer, the first internal wire, the second internal wire, and the upper heat transfer layer may be thermally connected to form a heat transfer path positioned to transfer heat from the first semiconductor chip to the upper package substrate.

The upper package may include at least a third internal wire thermally connected to the upper heat transfer layer.

In one embodiment, the lower heat transfer layer contacts the first semiconductor chip and contacts the first internal wire; and the upper heat transfer layer contacts the second internal wire and contacts the third internal wire.

In one embodiment, the upper heat transfer layer is formed of a thermal interface material.

In one embodiment, the lower heat transfer layer contacts the first semiconductor chip and contacts the first internal wire.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
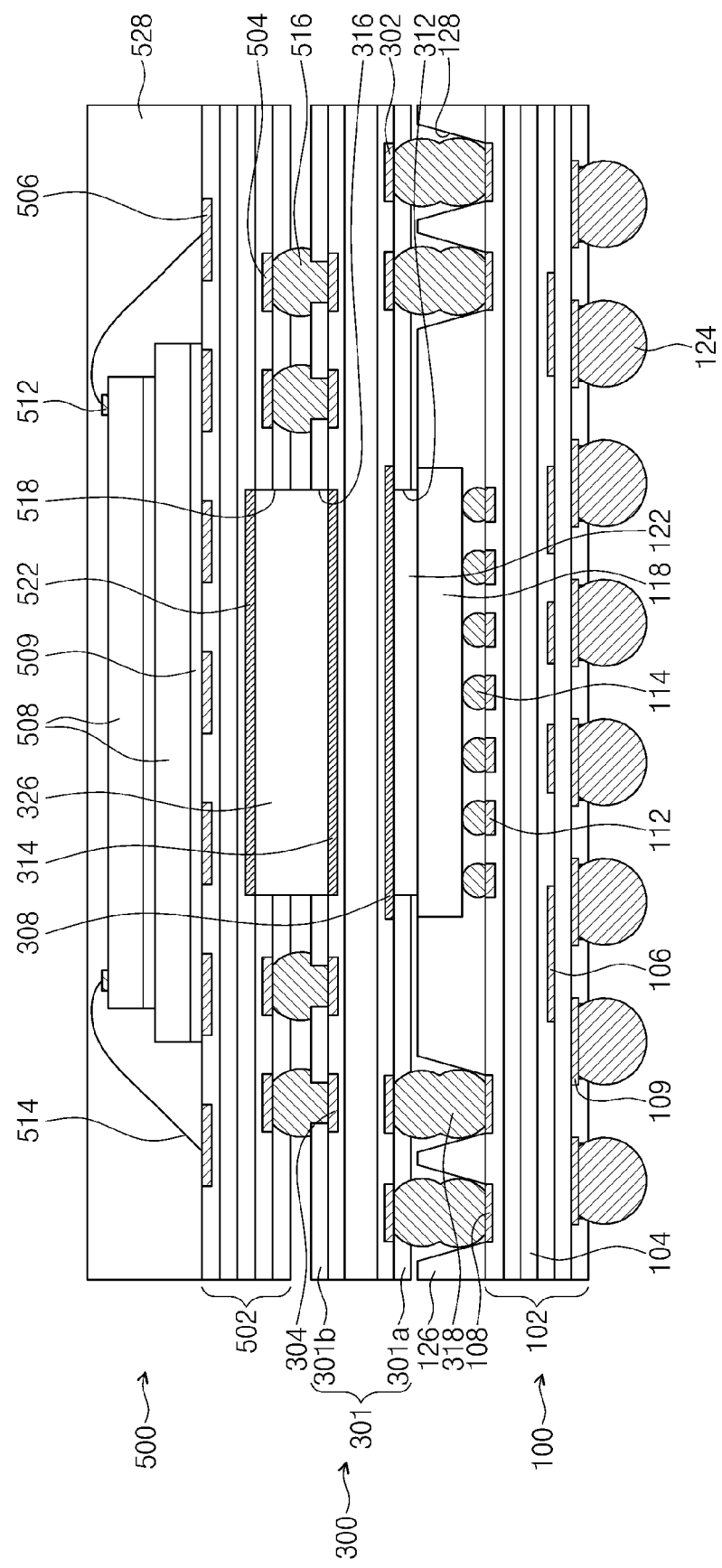
FIG. 1 is a sectional view illustrating a semiconductor package according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). However, the term "contact" refers to a direct contact, without intervening elements, unless the context indicates otherwise.

As used herein the term "and/or" includes any and all combinations of one or more of the associated listed items. Further, it will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The terms "thermal connection" and "heat transfer path" as used herein refer to a connection or path through a thermally conductive material. A thermally conductive material refers to a material typically described in the art as a thermal conductor, for example, one that induces heat transfer rather than preventing heat transfer or only incidentally transferring heat. Thermally conductive materials may be contrasted with materials typically described in the art as thermal insulators (such as, for example air, or glass).

Unless otherwise defined, all terms (including technical and scientific terms) used herein have the same meaning as commonly understood by one of ordinary skill in the art to which example embodiments of this disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
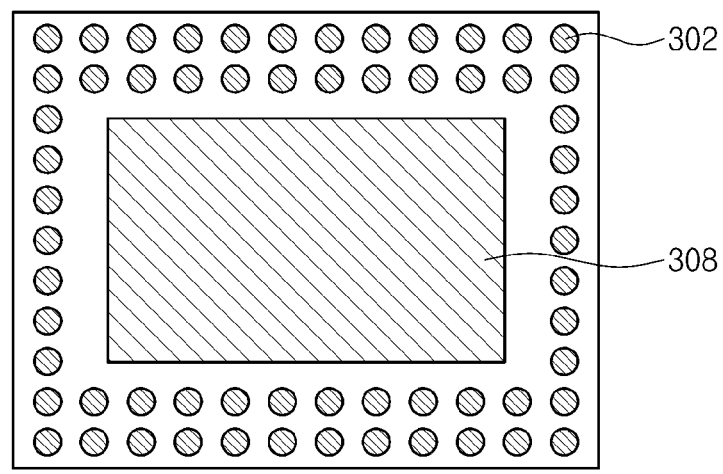
FIG. 2A is a sectional view illustrating a bottom surface of an interposer substrate according to example embodiments.
Figure 2B:
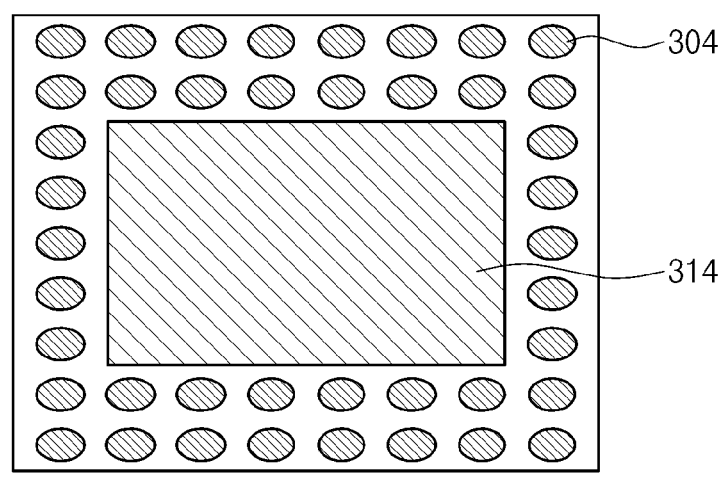
FIG. 2B is a sectional view illustrating a top surface of an interposer substrate according to example embodiments.
Figure 3:
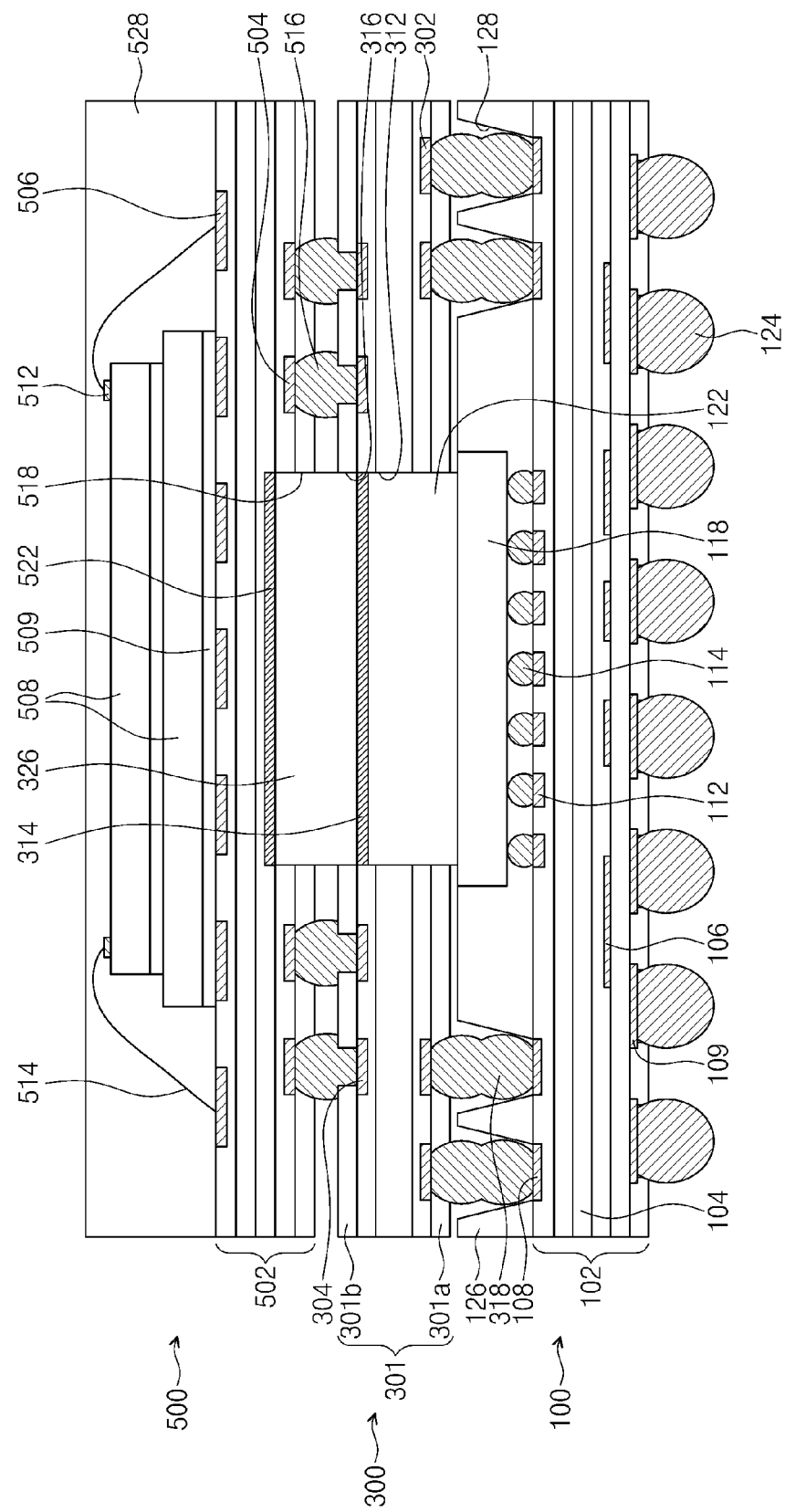
FIG. 3 is a sectional view illustrating a semiconductor package according to other example embodiments.

FIG. 1 is a sectional view illustrating a semiconductor package according to example embodiments. FIG. 2A is a sectional view illustrating a bottom surface of an interposer substrate according to example embodiments. FIG. 2B is a sectional view illustrating a top surface of an interposer substrate according to example embodiments. FIG. 3 is a sectional view illustrating a semiconductor package according to other example embodiments.

Referring to FIG. 1, a semiconductor package may include a lower package 100, an interposer 300, and an upper package 500. The interposer 300 may be stacked on the lower package 100, and the upper package 500 may be stacked on the interposer 300. For example, as shown in FIG. 1, the interposer 300 is disposed between the lower package 100 and the upper package 500.

The lower package 100 may include a lower package substrate 102, a lower semiconductor chip 118 disposed on the lower package substrate 102, and a lower molding layer 126 covering and/or surrounding the lower semiconductor chip 118 on the lower package substrate 102.

The lower package substrate 102 may be, for example, a printed circuit board (PCB) having a multilayered structure. For example, the lower package substrate 102 may include a plurality of insulating layers 104. Internal wires 106 may be disposed between the insulating layers 104. Lower connection pads 108 may be provided on a top surface of an edge (e.g., outer) portion of the lower package substrate 102. Chip pads 112 may be provided on a top surface of a central (e.g., inner) portion of the lower package substrate 102. Lower solder pads 109 may be provided on a bottom surface of the lower package substrate 102. Lower solder balls 124 may be attached on the lower solder pads 109, respectively. The lower solder balls 124 may connect an external device electrically to the semiconductor packages, according to example embodiments. Each of the pads and balls described herein may be generally referred to as terminals, or conductive terminals, or connection terminals. For example, lower solder balls 124 and lower solder pads 109, may be referred to, either separately, or as a combined element, as external connection terminals, which may be positioned to connect to the outside of the stacked semiconductor packages. Other pads, balls/bumps, or combinations thereof may be referred individually or collectively as connection terminals, such as internal connection terminals, etc., which may be positioned to connect internally within the stacked semiconductor packages.

The lower semiconductor chip 118 may be provided on the chip pads 112. For example, chip bumps 114 may be attached to a bottom surface of the lower semiconductor chip 118, and the chip bumps 114 may be in contact with the chip pads 112, respectively. Accordingly, the lower semiconductor chip 118 and the lower package substrate 102 may be electrically connected to each other, for example, through chip terminals. The lower semiconductor chip 118 may be, for example, a logic device, such as a microprocessor, or a memory device. Alternatively, the lower semiconductor chip 118 may include a memory device and a logic device.

The lower molding layer 126 may be formed to have through-holes 128 exposing top surfaces of the lower connection pads 108. Each of the through-holes 128 may have a sidewall, which is at an angle to the bottom surface of the lower semiconductor chip 118, and have a tapered shape. For example, a width of each through-hole 128 may decrease from top to bottom. In one embodiment, the lower molding layer 126 has a top surface that is coplanar with that of the lower semiconductor chip 118. For example, the lower semiconductor chip 118 may have a top surface exposed to the outside of the lower package 100. The lower molding layer 126 may be provided to fill gap regions between the chip bumps 114.

A lower heat-transfer layer 122 may be provided on a top surface of the lower semiconductor chip 118. The lower heat-transfer layer 122 may include, for example, a thermal interface material (TIM).

The interposer 300 may include an interposer substrate 301. The interposer substrate 301 may be, for example, a printed circuit board (PCB) having a multilayered structure. For example, the interposer substrate 301 may include a plurality of interposer insulating layers (not shown) and interposer metal wires (not shown) disposed between the interposer insulating layers. The interposer insulating layers may include a lowermost interposer insulating layer 301a and an uppermost interposer insulating layer 301b located at the lowermost and uppermost levels, respectively.

Lower interposer pads 302 may be provided on a bottom surface of the interposer substrate 301 to face the lower connection pads 108. For example, the lower interposer pads 302 may be provided on the lowermost interposer insulating layer 301a. Conductive connecting portions 318 may be provided in the through-holes 128 to connect the lower connection pads 108 to the lower interposer pads 302. For example, each of the conductive connecting portions 318 may have end portions, which are in contact with the lower interposer pad 302 and the lower connection pad 108, respectively. Each of the conductive connecting portions 318 may be in partial contact with a lower sidewall of the through-hole 128. Alternatively, the conductive connecting portions 318 may be spaced apart from the sidewalls of the through-holes 128. One or more of a lower interposer pad 302, its corresponding conductive connecting portion 318, and its corresponding lower connection pad 108, may be referred to as a connection terminal, such as a package-to-interposer connection terminal.

Referring to FIGS. 1 and 2A, the lowermost interposer insulating layer 301a may be formed to have a first heat-transfer opening 312. A lower interposer heat-transfer pad 308 may be provided on the lowermost interposer insulating layer 301a (e.g., to be within an interposer insulating layer above that) and have a bottom surface exposed (e.g., to an outside of the interposer 300) by the first heat-transfer opening 312. The lower interposer heat-transfer pad 308 may include, for example, a portion of the metal wires provided in the interposer substrate 301. The lower interposer heat-transfer pad 308 may be enclosed by the lower interposer pads 302 provided at an edge portion of the interposer substrate 301. The lower heat-transfer layer 122 may be provided in the first heat-transfer opening 312 to be in contact with the lower interposer heat-transfer pad 308. The lower heat-transfer layer 122 may have a width equivalent to a width of the first heat-transfer opening 312, and this makes it possible to provide the lower heat-transfer layer 122 in the first heat-transfer opening 312. In addition, the first heat-transfer opening 312 may be formed to have a depth that is substantially equal to or smaller than a thickness of the lower heat-transfer layer 122. In example embodiments, the depth of the first heat-transfer opening 312 may be smaller than the thickness of the lower heat-transfer layer 122, and thus, the top surface of the lower molding layer 126 may be spaced apart from the bottom surface of the lowermost interposer insulating layer 301a. In other example embodiments, although not shown, the depth of the first heat-transfer opening 312 may be the same as the thickness of the lower heat-transfer layer 122, and thus, the top surface of the lower molding layer 126 may be in contact with the bottom surface of the lowermost interposer insulating layer 301a.

The lower heat-transfer layer 122 may include, for example, a layer of heat-transmissive material that is positioned to transfer heat, but in some embodiments not to transfer electronic signals. The lower heat-transfer layer 122 may serve as a thermal connection between the lower semiconductor chip 118 and the lower interposer heat transfer pad 308, thus providing a heat transfer path to dissipate heat from the lower semiconductor chip 118 to the lower interposer heat transfer pad 308. In one embodiment, the lower heat-transfer layer 122 is not electrically connected to circuitry of the lower semiconductor package 100 or of the interposer 300 that is used for communications between stacked packages (e.g., the lower heat-transfer layer may be formed of a non-electrically-conductive material). In certain embodiments, the lower heat-transfer layer 122 has a plate-shaped form, and covers an area when viewed from a plan view that is as long as a plurality of the lower interposer pads 302 and as wide as a plurality of the lower interposer pads 302.

Referring to FIGS. 1 and 2B, the uppermost interposer insulating layer 301b may include a second heat-transfer opening 316. An upper interposer heat-transfer pad 314 may be provided on the uppermost interposer insulating layer 301b, and a top surface of the upper interposer heat-transfer pad 314 may be exposed (e.g., to an outside of the interposer 300) by the second heat-transfer opening 316. The upper interposer heat-transfer pad 314 may include, for example, a portion of the interposer metal wires. The lower and upper interposer heat-transfer pads 308 and 314 may be disposed between the interposer insulating layers (e.g., uppermost and lowermost) to face each other. Upper interposer pads 304 may be disposed at the edge (e.g., outer) portion of the interposer substrate 301. The upper interposer pads 304 may be disposed around the upper interposer heat-transfer pad 314. The upper interposer pads 304 may be exposed by the uppermost interposer insulating layer 301b (e.g., by an opening in this layer).

An upper heat-transfer layer 326 may be provided on the upper interposer heat-transfer pad 314. The upper heat-transfer layer 326 may have the same width as that of the second heat-transfer opening 316. The upper heat-transfer layer 326 may have a thickness greater than the depth of the first heat-transfer opening 312.

The upper heat-transfer layer 326 may include, for example, a layer of heat-transmissive material that is positioned to transfer heat, but in some embodiments not to transfer electronic signals. The upper heat-transfer layer 326 may serve as a thermal connection between the upper package substrate 502 and the upper interposer heat transfer pad 314, thus providing a heat transfer path to dissipate heat from the lower semiconductor chip 118 to the upper package substrate 502. In one embodiment, the upper heat-transfer layer 326 is not electrically connected to circuitry of the upper semiconductor package 500 or of the interposer 300 that is used for communications between stacked packages (e.g., the upper heat-transfer layer may be formed of a non-electrically-conductive material). In certain embodiments, the upper heat-transfer layer 326 has a plate-shaped form, and covers an area when viewed from a plan view that is as long as a plurality of the upper interposer pads 304 and as wide as a plurality of the upper interposer pads 304.

The upper package 500 may include an upper package substrate 502, one or more upper semiconductor chips 508, and an upper molding layer 528 covering and/or surrounding the upper semiconductor chips 508.

The upper package substrate 502 may be, for example, a printed circuit board (PCB). The upper package substrate 502 may include a plurality of insulating layers (not shown) and internal wires (not shown) disposed between the insulating layers, similar to the lower package substrate 102. Upper solder pads 504 may be provided on a bottom surface of an edge (e.g., outer) portion of the upper package substrate 502.

Upper solder balls 516 may be attached to bottom surfaces of the upper solder pads 504, respectively, and be in contact with the upper interposer pads 304, respectively. One or more of an upper interposer pad 304, its corresponding solder ball 516, and its corresponding upper solder pad 504, may be referred to as a connection terminal, such as a package-to-interposer connection terminal. Accordingly, the upper package 500 may be electrically connected to the lower package 100 through the interposer 300. In one embodiment, the interposer 300 does not include an integrated circuit. For example, the interposer 300 may include wiring for connecting between integrated circuits of the upper package 500 and lower package 100.

The upper package substrate 502 may include a third heat-transfer opening 518, which may be formed by recessing a bottom portion including a bottom surface of the upper package substrate 502. The third heat-transfer opening 518 may be formed, for example, between the upper solder balls 516 and in a central (e.g., inner) portion of the upper package substrate 502. An upper package heat-transfer pad 522 may be disposed between the insulating layers. The upper package heat-transfer pad 522 may include, for example, one of the internal wires provided in the upper package substrate 502. A bottom surface of the upper package heat-transfer pad 522 may be exposed to an outside of the upper package 500 by the third heat-transfer opening 518. The upper heat-transfer layer 326, which is disposed on the upper interposer heat-transfer pad 314 of the interposer substrate 301, may be provided in the third heat-transfer opening 518 to be in contact with the upper package heat-transfer pad 522. The upper heat-transfer layer 326 may have a width equivalent to the width of the third heat-transfer opening 518, and this makes it possible to provide the upper heat-transfer layer 326 in the third heat-transfer opening 518. In certain embodiments, the thickness of the upper heat-transfer layer 326 may be equal to or larger than a sum of depths of the second and third heat-transfer openings 316 and 518.

The one or more upper semiconductor chips 508 may be provided on the upper package substrate 502. The one or more upper semiconductor chips 508 may be attached to a top surface of the upper package substrate 502, for example, by an adhesive layer 509. The one or more upper semiconductor chips 508 may include, for example, a logic device, such as a microprocessor, and/or a memory device. Alternatively, one of the one or more upper semiconductor chips 508 may include a memory device and a logic device. Bonding pads 512 may be provided on the upper semiconductor chip 508. Wire pads 506 may be provided on a top surface of the upper package substrate 502. The bonding pad 512 may be connected to the wire pad 506, for example, through a bonding wire 514. Accordingly, the one or more upper semiconductor chips 508 may be electrically connected to the upper package substrate 502 through the bonding wire 514. As such, a bonding pad 512, corresponding bonding wire 514, and corresponding wire pad 506 may be collectively or individually referred to as connection terminals, for example, electrically connecting one or more semiconductor chips 508 and the upper package substrate 502 of the upper package 500. Further, the connection terminals that connect the one or more semiconductor chips 508 to the upper package substrate 502 need not include wires and wire bonding. Other connection arrangements may be used (e.g., flip chip or through via configurations).

According to example embodiments, if heat is generated from the lower semiconductor chip 118, the heat may pass through the lower heat-transfer layer 122, the lower interposer heat-transfer pad 308, the interposer substrate 301, the upper interposer heat-transfer pad 314, the upper heat-transfer layer 326, and the upper package heat-transfer pad 522, sequentially, and then, be transferred to the upper package substrate 502. Accordingly, the semiconductor package can have improved heat-dissipation characteristics.

Further, since the interposer 300 may be provided between the lower package 100 and the upper package 500, the upper solder balls 516 of the upper package 500 may be stacked on the interposer 300, without limitation of their size, and be electrically connected to the lower package 100.

Referring to FIG. 3, in one embodiment, the lower heat-transfer layer 122 may be in contact with the upper interposer heat-transfer pad 314. For example, the first heat-transfer opening 312 may be formed to expose the bottom surface of the upper interposer heat-transfer pad 314, and the lower heat-transfer layer 122 may be provided in the first heat-transfer opening 312 to be in direct contact with the upper interposer heat-transfer pad 314. In this case, an opening may be formed through the entire thickness of the interposer substrate 301, in which the lower heat-transfer layer 122, the upper interposer heat-transfer pad 314, and the upper heat-transfer layer 326 are disposed.

Figure 4:
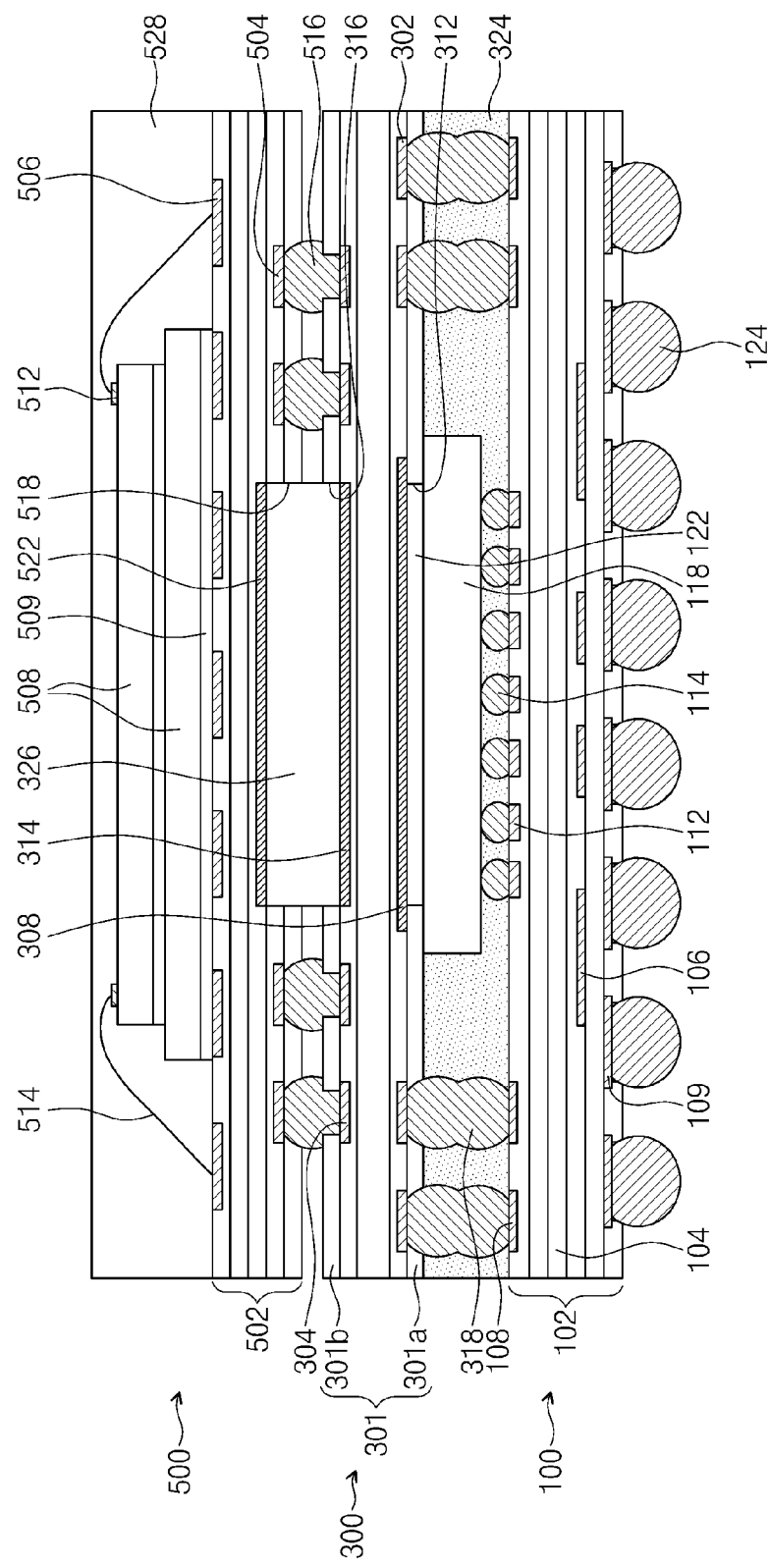
FIG. 4 is a sectional view illustrating a semiconductor package according to still other example embodiments.
Figure 5:
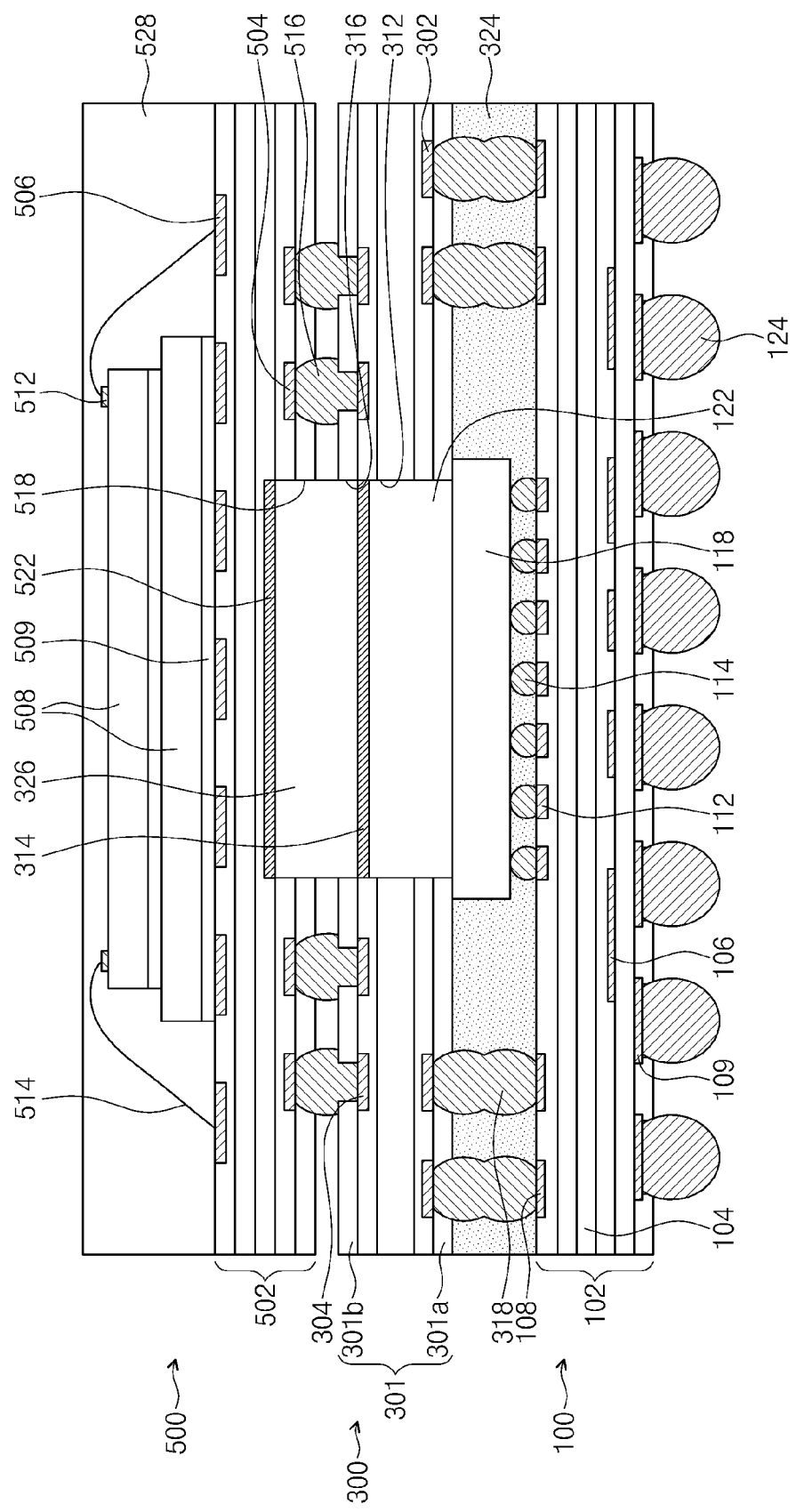
FIG. 5 is a sectional view illustrating a semiconductor package according to even other example embodiments.

FIG. 4 is a sectional view illustrating a semiconductor package according to still other example embodiments. FIG. 5 is a sectional view illustrating a semiconductor package according to even other example embodiments. In the following description of FIGS. 4 and 5, a previously described element may be identified by a similar or identical reference number without repeating an overlapping description thereof, for the sake of brevity.

Referring to FIGS. 4 and 5, an under-fill resin layer 324 may be formed to fill completely a gap region between the top surface of the lower package substrate 102 and the bottom surface of the interposer substrate 301. Accordingly, a portion of the conductive connecting portion 318 inserted into the under-fill resin layer 324 may be fully in contact with the under-fill resin layer 324.

Figure 6:
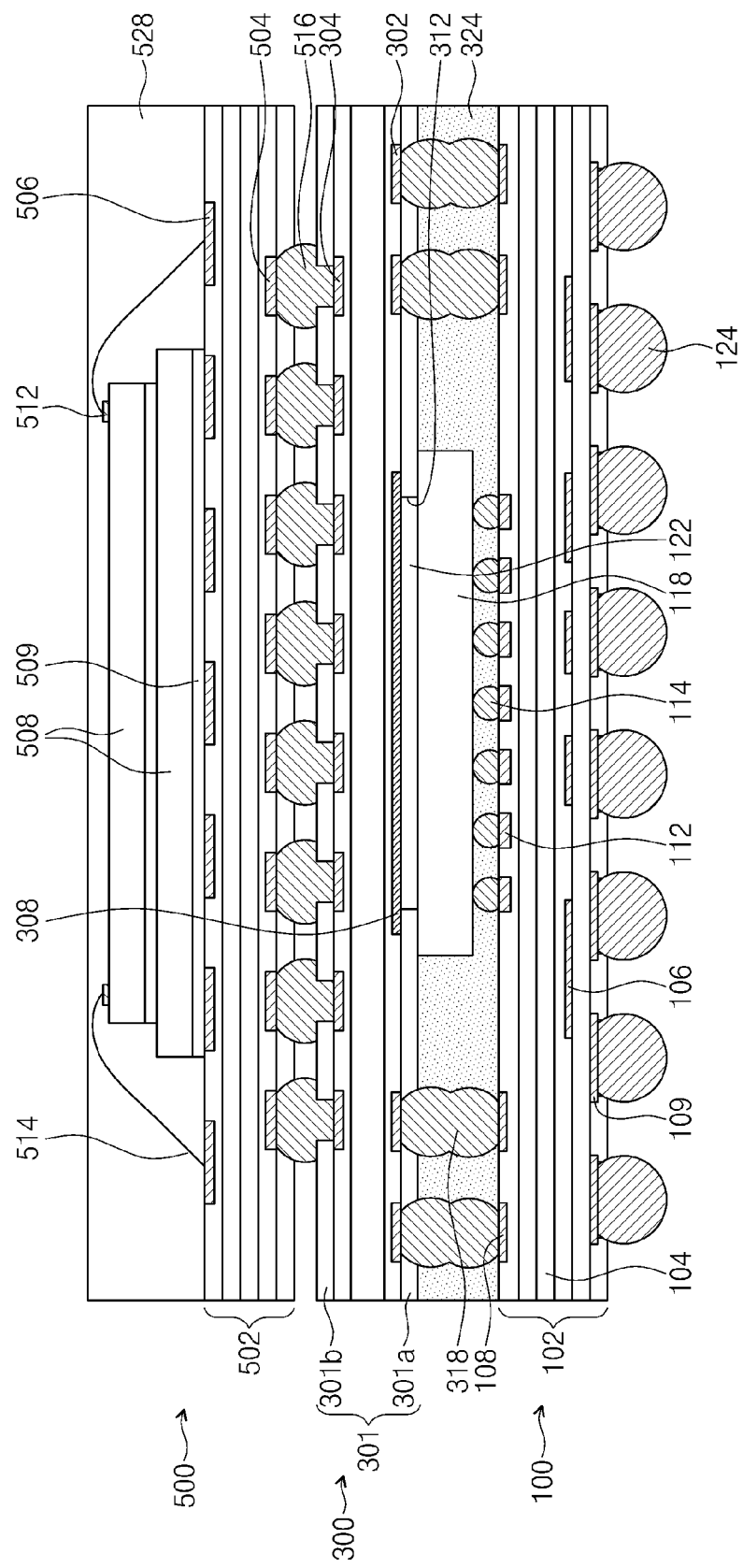
FIG. 6 is a sectional view illustrating a semiconductor package according to yet other example embodiments.
Figure 7A:
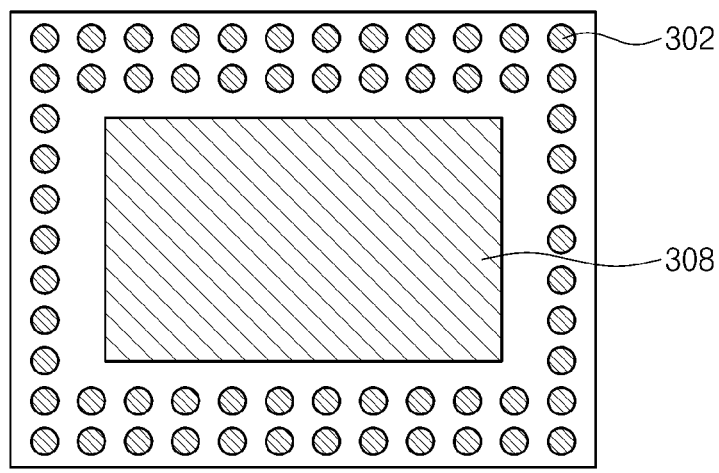
FIG. 7A is a plan view illustrating a bottom surface of an interposer substrate according to further example embodiments.
Figure 7B:
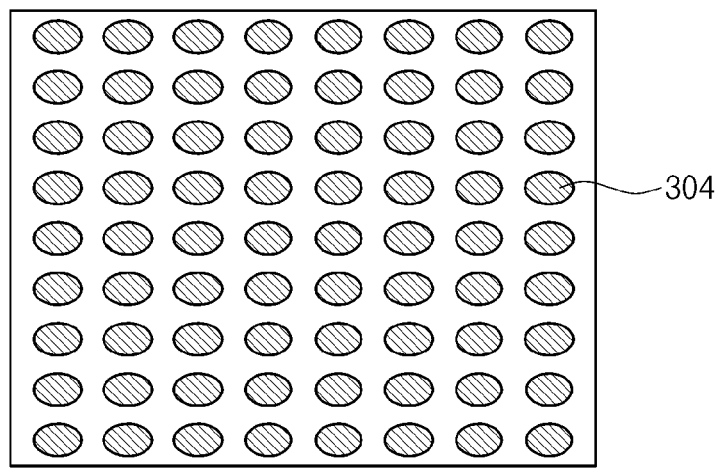
FIG. 7B is a plan view illustrating a top surface of an interposer substrate according to even further example embodiments.

FIG. 6 is a sectional view illustrating a semiconductor package according to yet other example embodiments. FIG. 7A is a plan view illustrating a bottom surface of an interposer substrate according to further example embodiments. FIG. 7B is a plan view illustrating a top surface of an interposer substrate according to even further example embodiments. In the following description of FIG. 6, a previously described element may be identified by a similar or identical reference number without repeating an overlapping description thereof, for the sake of brevity.

Referring to FIGS. 6 and 7A, the under-fill resin layer 324 may be formed to fill completely the gap region between the top surface of the lower package substrate 102 and the bottom surface of the interposer substrate 301. The lower heat-transfer layer 122 provided on the top surface of the lower semiconductor chip 118 may be in contact with the lower interposer heat-transfer pad 308.

Referring to FIGS. 6 and 7B, the upper interposer pads 304 may be arranged on the whole top surface of the interposer substrate 301. Further, the upper solder pads 504 may be arranged on the whole bottom surface of the upper package substrate 502. The upper interposer pads 304 and the upper solder pads 504 may be provided to face each other, and the upper solder balls 516 may be provided between the upper interposer pads 304 and the upper solder pads 504. One end portions of the upper solder balls 516 may be in electric contact with the upper interposer pads 304, and other end portions of the upper solder balls 516 may be in electric contact with the upper solder pads 504.

FIGS. 8A through 8G are sectional views illustrating a method of fabricating a semiconductor package, according to example embodiments.

Figure 8A:
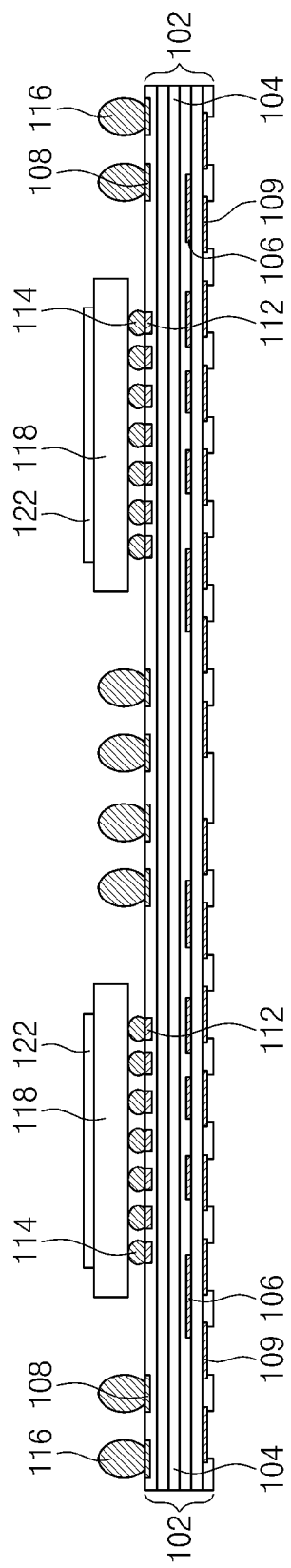
FIGS. 8A through 8G are sectional views illustrating a method of fabricating a semiconductor package, according to example embodiments.

Referring to FIG. 8A, the lower package substrate 102 is prepared. The lower package substrate 102 may be, for example, a printed circuit board (PCB). The lower package substrate 102 may include a plurality of insulating layers 104 and internal wires 106 disposed between the insulating layers 104. The lower connection pads 108 are provided on the top surface of the edge portion of the lower package substrate 102. The chip pads 112 are provided on the top surface of the central portion of the lower package substrate 102. The lower solder pads 109 are provided on the bottom surface of the lower package substrate 102.

The chip bumps 114 are formed on the chip pads 112. The chip bumps 114 may be formed using, for example, a screen print technique, an inkjet technique, a soldering technique, and so forth. Lower conductive connecting portions 116 may be formed on the lower connection pads 108. The lower conductive connecting portions 116 may be formed using, for example, a screen print technique, an inkjet technique, a soldering technique, and so forth. In certain embodiments, the chip bumps 114 and the lower conductive connecting portions 116 may be simultaneously formed using the same process. Further, the chip bumps 114 and the lower conductive connecting portions 116 may be formed to have the same size. A chip pad 112 and corresponding chip bump 114 may be referred to as a connection terminal. Similarly, a lower connection pad 108 and its corresponding lower conductive portion 116 may referred to as a connection terminal.

The lower semiconductor chip 118 may be attached on the chip bumps 114. Alternatively, the chip bumps 114 may be formed on the bottom surface of the lower semiconductor chip 118. The lower semiconductor chip 118 may be mounted in a flip-chip bonding manner to attach the chip bumps 114 to the chip pads 112. Accordingly, the lower semiconductor chip 118 may be electrically connected to the lower package substrate 102 via the chip bumps 114. The lower semiconductor chip 118 may be, for example, a logic device, such as a microprocessor, or a memory device. Alternatively, the lower semiconductor chip 118 may include a memory device and a logic device.

The lower heat-transfer layer 122 is formed on the lower semiconductor chip 118. The lower heat-transfer layer 122 may be formed, for example, using a paste technique, an inkjet printing technique, a spin coating technique, and so forth. The lower heat-transfer layer 122 may include a thermal interface material (TIM). The thermal interface material may include a thermally conductive material, and for example, be a thermal grease, a reactivity compound, an elastomer, or an adhesive film. In certain embodiments, the lower heat-transfer layer 122 includes a material that conducts heat more readily than the material, such as the insulative material, that forms the interposer substrate 301. The lower heat-transfer layer 122 may, however, conduct heat less readily than the lower interposer heat transfer pad 308.

Figure 8B:
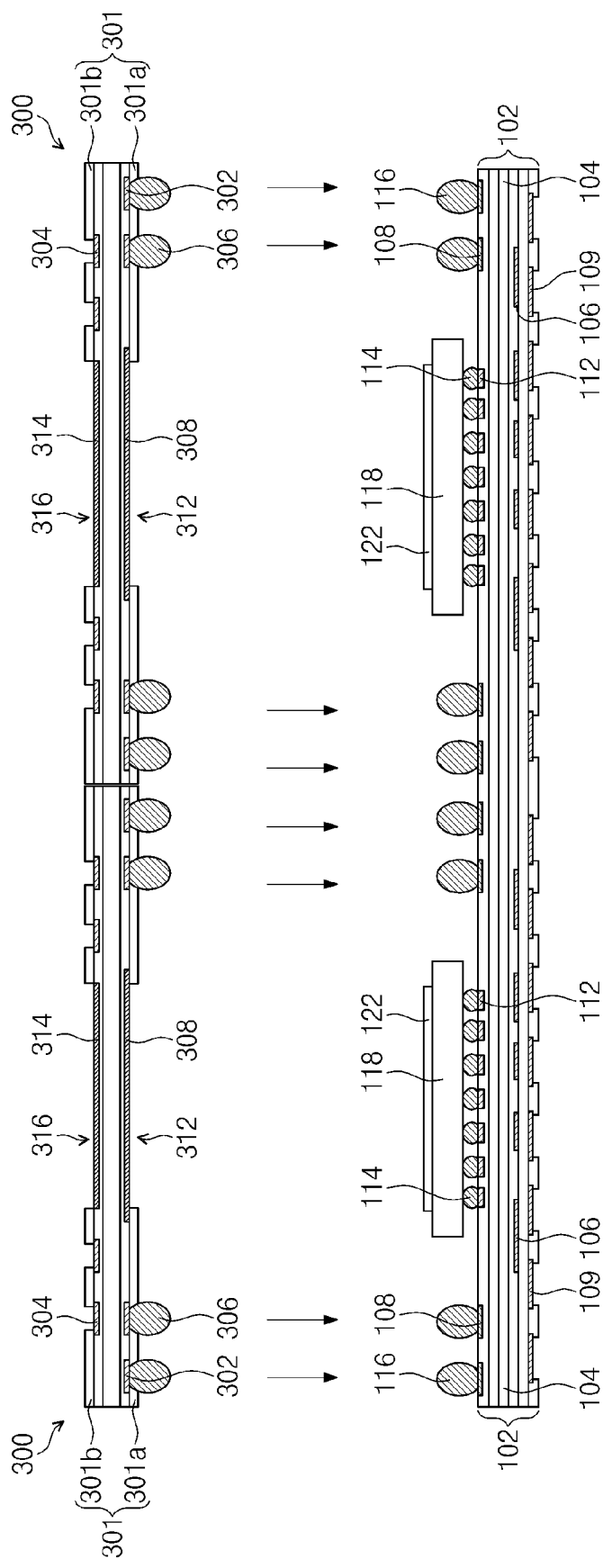
Figure 8C:
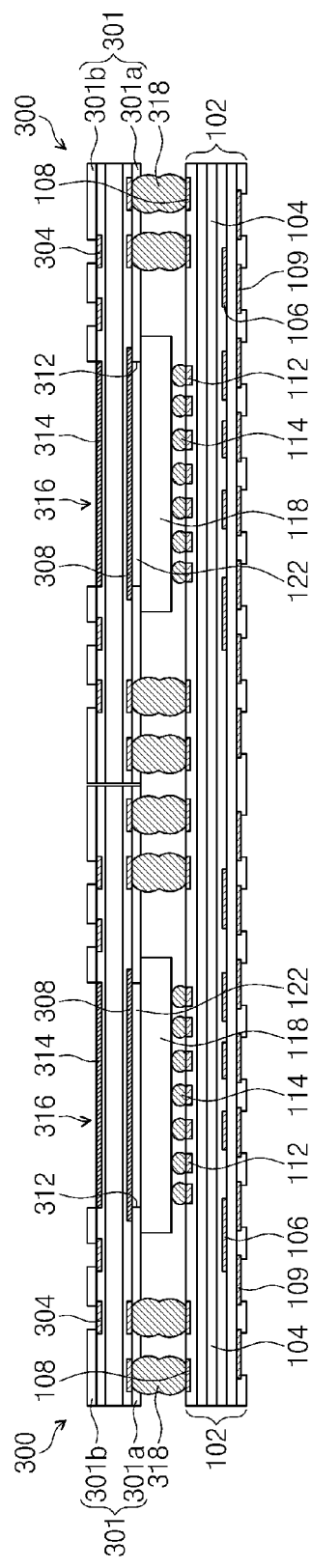

Referring to FIGS. 8B and 8C, the interposer 300 may be prepared, and then, the interposer 300 may be stacked on the lower package substrate 102 with the lower semiconductor chip 118.

The interposer 300 includes the interposer substrate 301. The interposer substrate 301 may be, for example, a printed circuit board (PCB) having a multilayered structure. For example, the interposer substrate 301 may include a plurality of interposer insulating layers (not shown) and interposer metal wires (not shown) disposed between the interposer insulating layers. The lower interposer pads 302 may be provided on a bottom surface of an edge portion of the interposer substrate 301, and the upper interposer pads 304 may be formed on a top surface of the edge portion of the interposer substrate 301. Upper conductive connecting portions 306 may be attached on the lower interposer pads 302, respectively.

The interposer insulating layers include the lowermost interposer insulating layer 301a constituting the lowermost layer of the interposer insulating layers. In one embodiment, lowermost interposer insulating layer 301a is partially etched to form the first heat-transfer opening 312 exposing the bottom surface of the lower interposer heat-transfer pad 308. The first heat-transfer opening 312 may be formed to have a width that is substantially equal to or larger than that of the lower heat-transfer layer 122. The lower interposer heat-transfer pad 308 may include, for example, a portion of the interposer metal wires. The lower interposer heat-transfer pad 308 may contain copper (Cu).

The interposer insulating layers further include the uppermost interposer insulating layer 301b constituting the uppermost layer of the interposer insulating layers. The uppermost interposer insulating layer 301b is partially etched to form the second heat-transfer opening 316 exposing the top surface of the upper interposer heat-transfer pad 314. The upper interposer heat-transfer pad 314 may include a portion of the interposer metal wires and may be formed of the same material as the lower interposer heat-transfer pad 308.

The lower heat-transfer layer 122 is then inserted in the first heat-transfer opening 312 to be in contact with the lower interposer heat-transfer pad 308. Further, to stack the interposer substrate 301 on the lower package substrate 102, the lower conductive connecting portions 116 may be electrically connected to the upper conductive connecting portions 306, respectively. For example, the lower conductive connecting portions 116 may be attached to the upper conductive connecting portions 306 to face each other, and then, a reflow process may be performed to melt the lower and upper conductive connecting portions 116 and 306. As a result, the conductive connecting portion 318 may be formed.

Figure 8D:
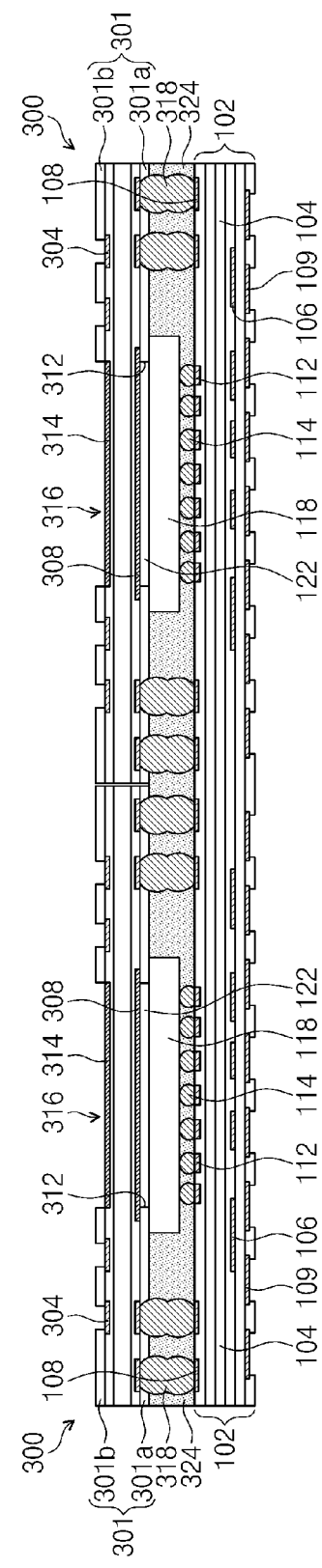

Referring to FIG. 8D, the under-fill resin layer 324 may be formed to fill a gap region between the lower package substrate 102 and the interposer substrate 301. The formation of the under-fill resin layer 324 may include, for example, supplying under-fill resin solution (not shown) between the lower package substrate 102 and the interposer substrate 301, and then, curing the under-fill resin solution. By virtue of good flowability of the under-fill resin solution, spaces between the lower package substrate 102 and the interposer substrate 301, between the chip bumps 114, and between the conductive connecting portions 318 can be rapidly filled with the under-fill resin solution.

According to example embodiments, in the package process of fabricating a semiconductor package, the lower package substrate 102 and the interposer 300 can be electrically connected to each other, without using a laser drilling process. Accordingly, the package process can be simplified, and this makes it possible to reduce a cost of the package process.

Figure 8E:
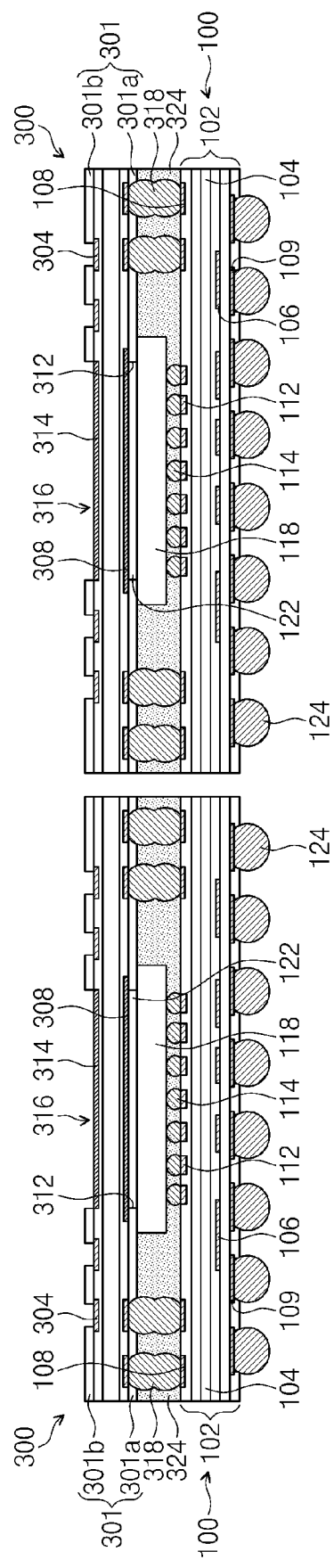

Referring to FIG. 8E, external connection terminals, such as the lower solder balls 124 may be attached on the lower solder pads 109. Thereafter, the lower package substrate 102 may be sawn to divide the lower semiconductor chips 118 mounted on the lower package substrate 102 into a plurality of unit packages separated from each other. As the result of the sawing process of the lower package substrate 102, a plurality of the lower packages 100, on which the interposers 300, respectively, are stacked, may be formed from one lower package substrate 102.

Figure 8F:
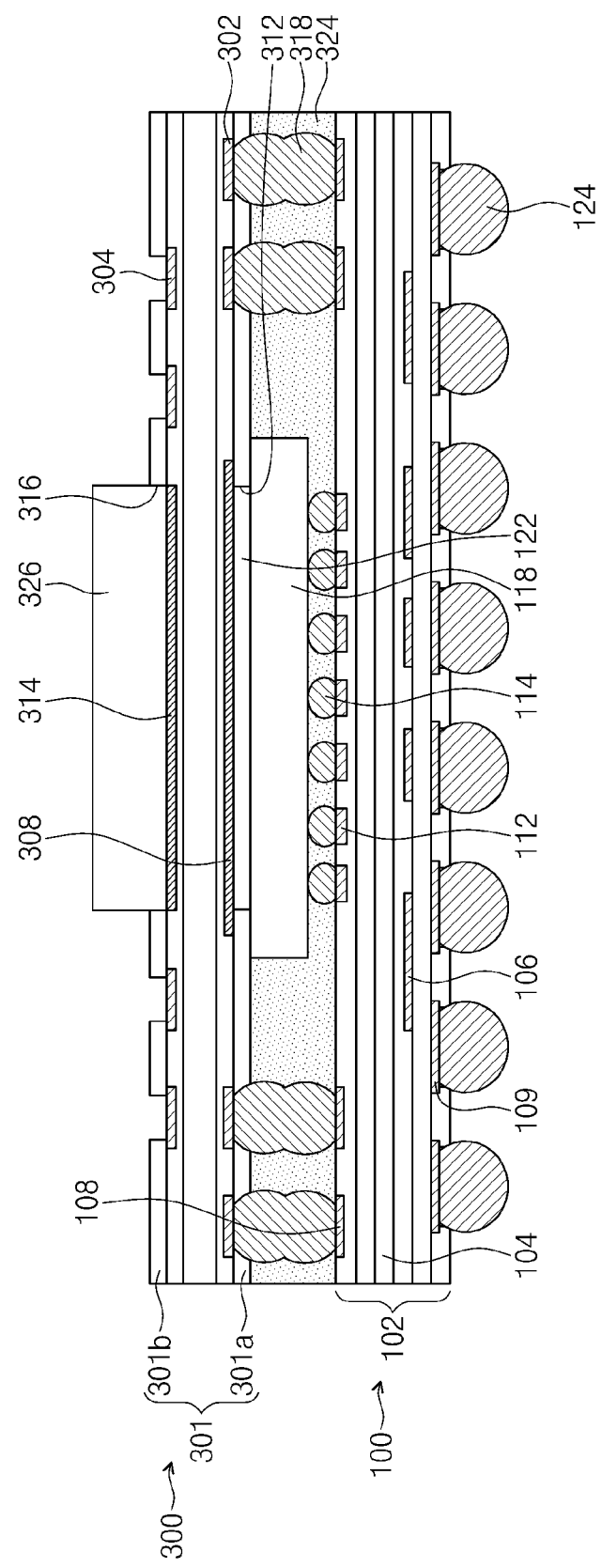

Referring to FIG. 8F, the upper heat-transfer layer 326 may be formed on the upper interposer heat-transfer pad 314. The upper heat-transfer layer 326 may be formed, for example, using a paste technique, an inkjet printing technique, a spin coating technique, and so forth. The upper heat-transfer layer 326 may include a thermal interface material (TIM). The upper heat-transfer layer 326 may include a thermally conductive material, and for example, be a thermal grease, a reactivity compound, an elastomer, or an adhesive film. The upper heat-transfer layer 326 may be formed to have a thickness larger than a depth of the second heat-transfer opening 316, and thus, the upper heat-transfer layer 326 may protrude from the interposer substrate 301. In certain embodiments, the upper heat-transfer layer 326 includes a material that conducts heat more readily than the material, such as the insulative material, that forms the interposer substrate 301 and/or the material that forms the upper package substrate 502. The upper heat-transfer layer 326 may, however, conduct heat less readily than the upper interposer heat transfer pad 314 and/or the upper package heat transfer pad 522.

Figure 8G:
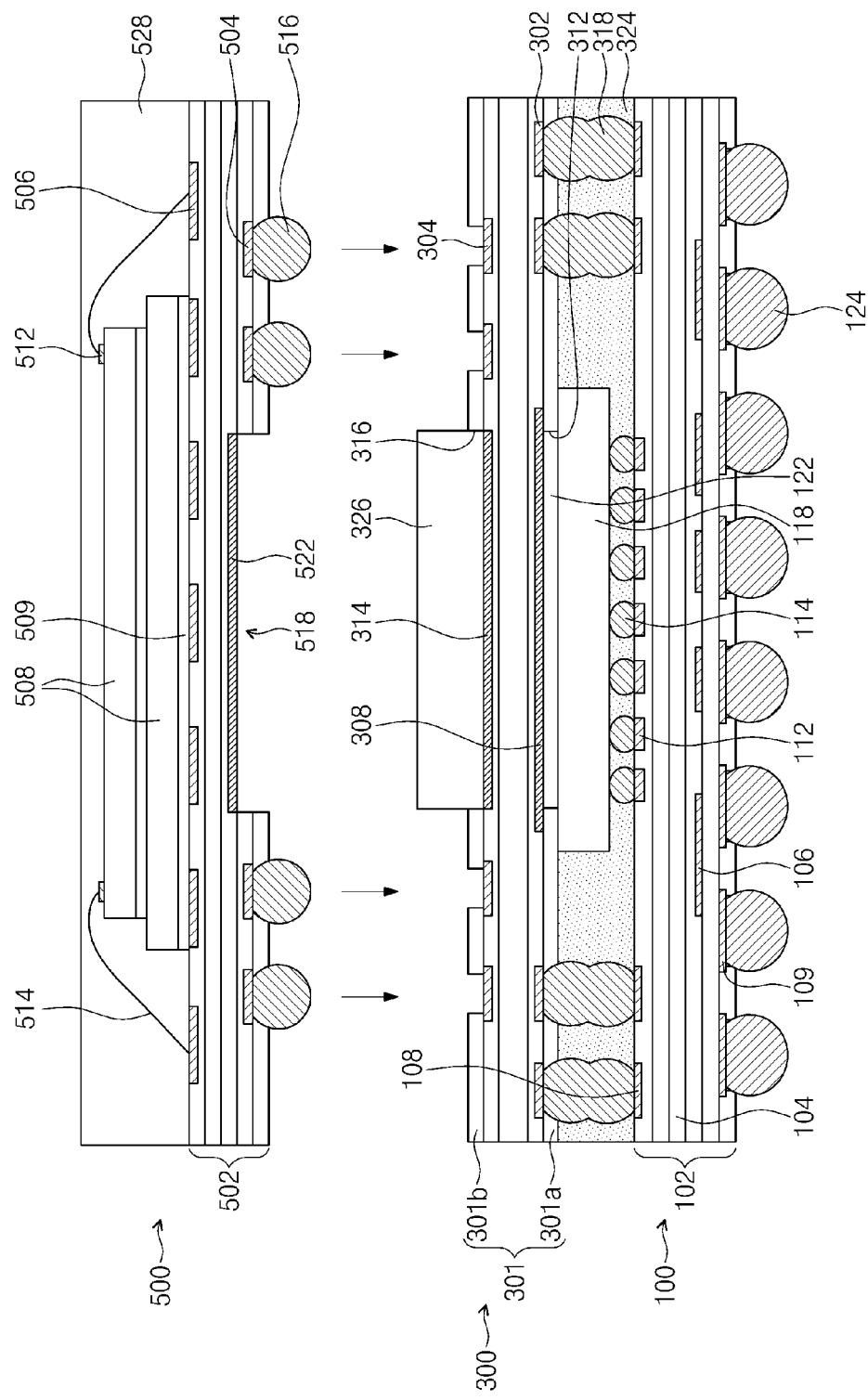

Referring to FIGS. 8G and 4, the upper package 500 is stacked on the interposer 300.

The upper package 500 may include the upper package substrate 502, one or more upper semiconductor chips 508, and the upper molding layer 528 covering the upper semiconductor chip 508.

The upper package substrate 502 may be, for example, a printed circuit board (PCB). The upper package substrate 502 may include a plurality of insulating layers (not shown) and internal wires (not shown) disposed between the insulating layers, similar to the lower package substrate 102. The upper solder pads 504 are provided on the bottom surface of the edge portion of the upper package substrate 502. The upper solder balls 516 are attached to the bottom surfaces of the upper solder pads 504, respectively.

The bottom surface of the upper package substrate 502 may be partially etched to form the third heat-transfer opening 518. The third heat-transfer opening 518 may be formed between the upper solder balls 516 and in the central portion of the upper package substrate 502. The third heat-transfer opening 518 may be formed to have the same width as that of the upper heat-transfer layer 326. The third heat-transfer opening 518 may be formed to expose the bottom surface of the upper package heat-transfer pad 522 provided in the upper package substrate 502. The upper package heat-transfer pad 522 may be, for example, one of the internal wires provided in the upper package substrate 502.

In one embodiment, the upper heat-transfer layer 326 is provided in the third heat-transfer opening 518 to be in contact with the upper package heat-transfer pad 522. Thereafter, the upper solder balls 516 are positioned to be in electric contact with the upper interposer pads 304. Accordingly, the upper package 500 may be electrically connected to the lower package 100 via the interposer 300.

Figure 9:
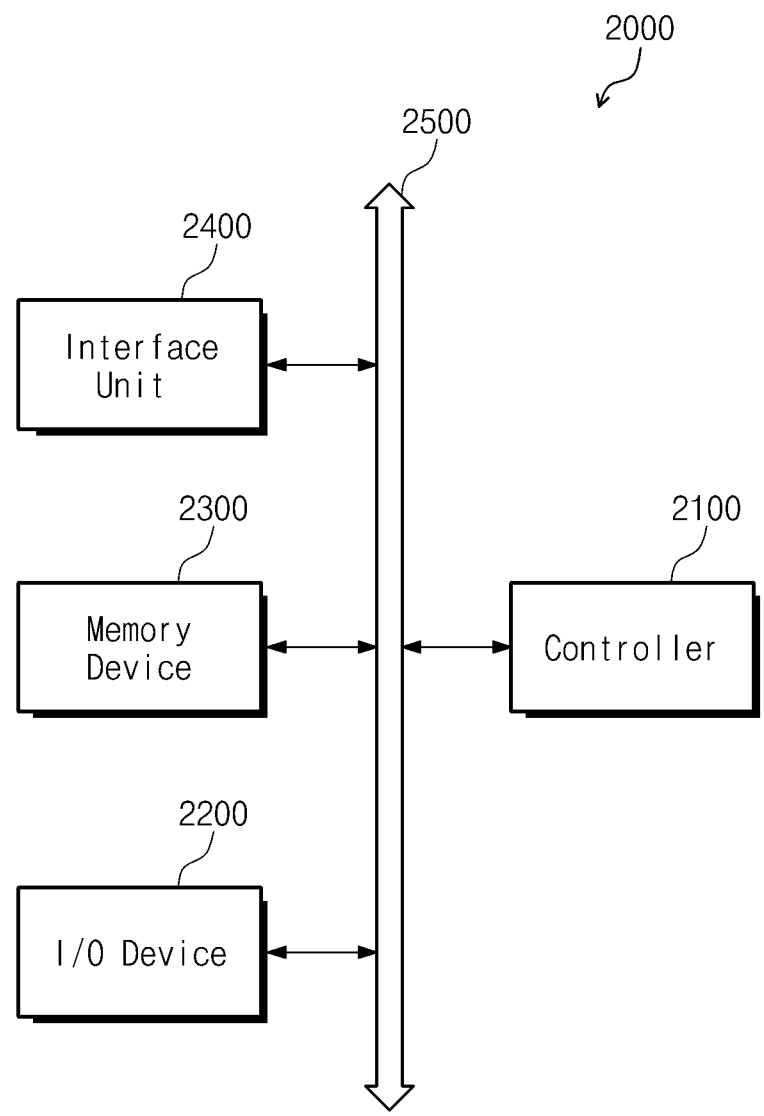
FIG. 9 is a block diagram illustrating an example of electronic systems including semiconductor packages according to example embodiments.
Figure 10:
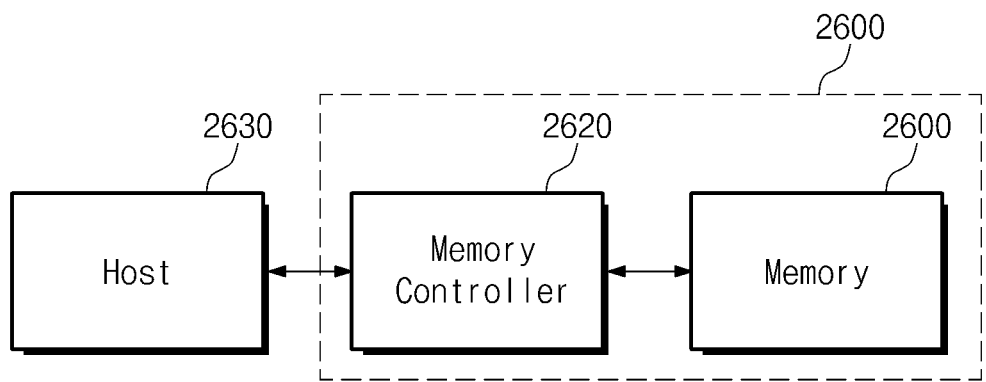
FIG. 10 is a block diagram illustrating an example of memory systems including semiconductor packages according to example embodiments.

FIG. 9 is a block diagram illustrating an example of electronic systems including semiconductor packages according to exemplary embodiments. FIG. 10 is a block diagram illustrating an example of memory systems including semiconductor packages according to exemplary embodiments.

Referring to FIG. 9, an electronic system 2000 according to one embodiment includes a controller 2100, an input/output (I/O) device 2200, a memory device 2300, and a data bus 2500. At least two of the controller 2100, the I/O device 2200 and the memory device 2300 may communicate with each other through the data bus 2500. The data bus 2500 may correspond to a path through which electrical signals are transmitted. The controller 2100 may include, for example, at least one of a microprocessor, a digital signal processor, a microcontroller, and a logic device. The logic device may have a similar function to any one of the microprocessor, the digital signal processor and the microcontroller. The controller 2100 and/or the memory device 2300 may include at least one of the semiconductor packages described in the above embodiments. In addition, the controller 2100 and memory device 2300 may be combined to form one of the semiconductor packages described above. The I/O device 2200 may include at least one of a keypad, a keyboard and a display device. The memory device 2300 may store data and/or commands executed by the controller 2100. The memory device 2300 may include a volatile memory device and/or a nonvolatile memory device. For example, the memory device 2300 may include a flash memory device to which the package techniques according to the embodiments are applied. The flash memory device may constitute a solid state disk (SSD). In this case, the solid state disk including the flash memory device may stably store a large capacity of data. The electronic system 2000 may further include an interface unit 2400. The interface unit 2400 may transmit data to a communication network or may receive data from a communication network. The interface unit 2400 may operate by wireless or cable. For example, the interface unit 2400 may include an antenna for wireless communication or a transceiver for cable communication. Although not shown in the drawings, the electronic system 2000 may further include an application chipset and/or a camera image sensor.

The electronic system 2000 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 2000 performs wireless communication, the electronic system 2000 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 10, a memory card 2600 may include a non-volatile memory device 2610 and a memory controller 2620. The non-volatile memory device 2610 and the memory controller 2620 may store data or read stored data. The non-volatile memory device 2610 and/or memory controller 2620 may comprise at least one non-volatile memory device, to which the semiconductor package technology according to example embodiments described above is applied. The memory controller 2620 may control the non-volatile memory device 2610 in order to read the stored data and/or to store data in response to read/write request of a host 2630.

Though examples are given above for a two-package device having an interposer in therebetween, where each package has a certain number of illustrated semiconductor chips, other arrangements may be used. For example, different numbers of semiconductor chips that the amount shown in the figures may be used for each package. Also, a different number of packages may be included in the package-on-package device (also referred to herein as a stacked package device) that employs the embodiments described above.

While example embodiments have been particularly shown and described, it will be understood by one of ordinary skill in the art that variations in form and detail may be made therein without departing from the spirit and scope of the attached claims.

What is claimed is:

1. A semiconductor package, comprising:
a lower package including a lower package substrate, a lower semiconductor chip disposed on the lower package substrate, and a lower heat-transfer layer disposed on the lower semiconductor chip;
an interposer provided on the lower package, the interposer comprising an interposer substrate, a first heat-transfer opening defined by a recessed bottom surface of the interposer substrate, a second heat-transfer opening defined by a recessed top surface of the interposer substrate, an upper interposer heat-transfer pad disposed in the second heat-transfer opening, and an upper heat-transfer layer disposed on the upper interposer heat-transfer pad; and
an upper package provided on the interposer, the upper package comprising an upper package substrate, an upper package heat-transfer pad disposed in a third heat-transfer opening defined by a recessed bottom surface of the upper package substrate, and an upper semiconductor chip disposed on the upper package substrate,
wherein the lower heat-transfer layer is provided in the first heat-transfer opening to be in contact with the upper interposer heat-transfer pad exposed to the first heat-transfer opening, and the upper heat-transfer layer is provided in the third heat-transfer opening to contact the upper package heat-transfer pad.

2. The semiconductor package of claim 1, further comprising a lower interposer heat-transfer pad provided spaced apart from the upper interposer heat-transfer pad and disposed in the first heat-transfer opening,
wherein the lower interposer heat-transfer pad contacts the lower heat-transfer layer.

3. The semiconductor package of claim 2, wherein:
the interposer substrate includes internal wires and the lower interposer heat-transfer pad includes a portion of internal wires of the interposer substrate; and
the lower heat-transfer layer is formed of a thermal interface material.

4. The semiconductor package of claim 1, further comprising conductive connecting portions interposed between the lower package and the interposer to connect the lower package electrically to the interposer.

5. The semiconductor package of claim 4, further comprising an under-fill resin layer filling a gap region between the lower package and the interposer and contacting the conductive connecting portions.

6. The semiconductor package of claim 4, further comprising a lower molding layer provided on the lower package substrate to cover the lower semiconductor chip,
wherein the lower molding layer is provided to define through-holes, in which the conductive connecting portions, respectively, are disposed.

7. The semiconductor package of claim 1, wherein the interposer substrate is a printed circuit board including a plurality of insulating layers and internal wires provided between the insulating layers.

8. The semiconductor package of claim 7, wherein the upper interposer heat-transfer pad includes a portion of the internal wires.

9. The semiconductor package of claim 1, wherein the lower heat-transfer layer has a thickness that is equal to or larger than a depth of the first heat-transfer opening.

10. The semiconductor package of claim 1, wherein the upper heat-transfer layer has a thickness that is equal to or larger than a sum of depths of the second and third heat-transfer openings.

11. The semiconductor package of claim 1, further comprising upper solder balls provided on the bottom surface of the upper package substrate that electrically contact the top surface of the interposer substrate.

12. A semiconductor package, comprising:
a lower package including a lower package substrate and at least a first semiconductor chip disposed thereon;
an interposer stacked on the lower package, the interposer:
including internal wires and a plurality of insulating layers,
having an upper surface and a lower surface, and
including an upper recess at the upper surface and a lower recess, opposite the upper recess, at the lower surface;
an upper package including an upper package substrate and at least a second semiconductor chip disposed thereon; and
a lower heat transfer layer formed of a thermal interface material, the lower heat transfer layer disposed in the lower recess and thermally connecting the first semiconductor chip to at least a first internal wire of the interposer.

13. The semiconductor package of claim 12, further comprising:
an upper heat transfer layer, the upper heat transfer layer disposed in the upper recess and thermally connecting the upper package substrate to at least a second internal wire of the interposer.

14. The semiconductor package of claim 13, wherein:
at least the lower heat transfer layer, the first internal wire, the second internal wire, and the upper heat transfer layer are thermally connected to form a heat transfer path positioned to transfer heat from the first semiconductor chip to the upper package substrate.

15. The semiconductor package of claim 14, wherein:
the upper package includes at least a third internal wire thermally connected to the upper heat transfer layer.

16. The semiconductor package of claim 15, wherein:
the lower heat transfer layer contacts the first semiconductor chip and contacts the first internal wire; and
the upper heat transfer layer contacts the second internal wire and contacts the third internal wire.

17. The semiconductor package of claim 13, wherein:
the upper heat transfer layer is formed of a thermal interface material.

18. The semiconductor package of claim 12, wherein:
the lower heat transfer layer contacts the first semiconductor chip and contacts the first internal wire.

19. A method of fabricating a semiconductor package, comprising:
forming lower conductive connecting portions on a lower package substrate;
mounting a lower semiconductor chip on the lower package substrate provided with the lower conductive connecting portions;
forming a lower heat-transfer layer on the lower semiconductor chip;
stacking an interposer, including an interposer substrate and upper conductive connecting portions attached to a bottom surface of the interposer substrate, on the lower semiconductor chip, in such a way that the upper conductive connecting portions are attached to the lower conductive connecting portions;

performing a reflow process to the lower and upper conductive connecting portions to form conductive connecting portions;

forming an under-fill resin layer between the lower package substrate and the interposer substrate; and stacking an upper package on the interposer.

20. The method of claim 19, further comprising, before the stacking of the interposer, etching a portion of a bottom surface of the interposer substrate to form a first heat-transfer opening exposing a lower interposer heat-transfer pad; and etching a portion of a top surface of the interposer substrate to form a second heat-transfer opening exposing an upper interposer heat-transfer pad.

21. The method of claim 20, wherein the stacking of the interposer comprises providing the lower heat-transfer layer in the first heat-transfer opening to be in contact with the lower interposer heat-transfer pad.

* * * * *